United States Patent
Kreissig et al.

(10) Patent No.: US 7,719,842 B2
(45) Date of Patent: *May 18, 2010

(54) METHOD OF PROVIDING FLEXIBLE HEAT SINK INSTALLATIONS FOR EARLY BLADE BOARD MANUFACTURING

(75) Inventors: Gerald Kreissig, Herrenberg (DE); Wolfgang Bollinger, Herrenberg (DE); Roland Dieterle, Holzgerlingen (DE); Hartmut Droege, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 139 days.

This patent is subject to a terminal disclaimer.

(21) Appl. No.: 12/032,950

(22) Filed: Feb. 18, 2008

(65) Prior Publication Data

US 2009/0205197 A1 Aug. 20, 2009

(51) Int. Cl.
H05K 7/20 (2006.01)
(52) U.S. Cl. ............... 361/719; 361/702; 361/704; 361/709; 361/679.54; 165/80.3; 165/185; 257/718; 257/719; 174/16.3; 174/252; 29/832
(58) Field of Classification Search ......... 361/702–712, 361/714, 715, 717–722, 731, 732, 735, 737, 361/740–742, 753, 756, 758, 760, 785, 790, 361/820, 825, 679.46, 679.54; 165/80.2–80.5, 165/104.33, 104.34, 185; 174/15.1, 16.3, 174/252; 257/706–727; 29/832, 840, 841, 29/842

See application file for complete search history.

(56) References Cited

U.S. PATENT DOCUMENTS

| | | | |
|---|---|---|---|
| 4,942,497 A * | 7/1990 | Mine et al. ................. 361/702 |
| 5,339,215 A * | 8/1994 | Nishiguchi ................. 361/704 |
| 5,808,236 A | 9/1998 | Brezina et al. |
| 5,862,038 A * | 1/1999 | Suzuki et al. ............... 361/704 |
| 5,999,407 A * | 12/1999 | Meschter et al. ............ 361/704 |
| 6,002,591 A * | 12/1999 | McCutchan et al. ......... 361/753 |
| 6,075,699 A | 6/2000 | Rife |
| 6,313,995 B1 * | 11/2001 | Koide et al. ................ 361/705 |
| 6,506,073 B2 * | 1/2003 | McCutchan et al. ...... 439/540.1 |
| 6,538,889 B1 * | 3/2003 | Barsun et al. ............... 361/704 |
| 6,687,129 B1 * | 2/2004 | Wilson et al. ............... 361/730 |
| 6,704,195 B2 * | 3/2004 | Cravens et al. ......... 361/679.47 |
| 6,972,485 B2 | 12/2005 | Kong et al. |
| 7,113,406 B1 | 9/2006 | Nguyen et al. |
| 7,120,027 B2 * | 10/2006 | Yatskov et al. ............. 361/716 |
| 7,206,206 B2 * | 4/2007 | Lin et al. .................... 361/719 |
| 7,492,598 B2 * | 2/2009 | Narasimhan et al. ........ 361/719 |

* cited by examiner

*Primary Examiner*—Michael V Datskovskiy
(74) *Attorney, Agent, or Firm*—The Law Firm of Andrea Hence Evans, LLC

(57) ABSTRACT

An apparatus for mounting a plurality of heat sinks onto a circuit board during testing while the circuit board is tested in a fixed manufacturing station. The apparatus has a polygonal shaped frame with a size that is limited to an area on the circuit board which contains a plurality of data processing elements to be cooled. At least four apertures are on the frame, wherein each of the apertures corresponds to a different one of the plurality of data processing elements to be cooled. A slot is positioned on the frame to receive oversized processing elements. At least four pillars extend from the frame and mount into mounting holes provided on the circuit board. The apertures on the frame support the heat sinks above the data processing elements to be cooled. No additional screws, adhesives, clips or other fixing mechanisms are required to secure the heat sinks.

1 Claim, 3 Drawing Sheets

METHOD OF PROVIDING FLEXIBLE HEAT SINK INSTALLATIONS FOR EARLY BLADE BOARD MANUFACTURING

FIELD OF THE INVENTION

The present invention relates in general to installations or frames for heat sinks used in a data processing system during testing of boards.

BACKGROUND OF THE INVENTION

In a blade board system, each blade or circuit board contains components such as microprocessors, memory, network, interfaces, disk drives, etc., depending on the blade's intended function. The terms blade, blade board, circuit board and board are used interchangeably and have the same definition. The circuit boards plug into slots or sockets in a bus which interconnects the boards. Buses are used to distribute signals between or among components or subsystems such as memories or processors, for example.

After the assembling of a blade board, the manufacturer executes a number of tests that do not require the board to be powered such as in-circuit tests and flying-probe tests. Most severe errors such as noise, misplaced components and bad soldering are found during logic tests. Logic tests are performed by executing programs. To perform logic tests, it is necessary to attach power to the board and execute logic tests on the microprocessor to test the assembled parts like memory, I/O chips, to name a few. As the power level increases, the microprocessor generates excess heat which must be dissipated by some means. Conventionally, a heat sink, a thermally conductive device, is used to dissipate heat from one or more circuit board components into the surrounding air. Typically, a heat sink is mounted to a circuit board component.

Conventional approaches of mounting a heat sink include screwing the heat sink onto the board or using an adhesive to be applied to the heat sink which is then directly placed onto the circuit board component. Both approaches require additional time spent during the manufacturing process. For example, when using the adhesive approach, pressure must be applied to the heat sink for a strict amount of time to provide adequate holding strength. Similarly, screwing the heat sink to the board requires careful attention paid to where the screws are secured and to whether the screws have scratched or cut the surface of the circuit board.

Due to time constraints and possible damage from the adhesive or screws to the circuit board if the heat sink were removed, the heat sinks stay permanently fixed on the board during manufacturing. There are several disadvantages of fixing a heat sink to the circuit board during this early circuit board manufacturing phase. One disadvantage is that using screws to secure the heat sink utilizes space immediately around the circuit board component. Specifically, screwed heat sinks cover more area then the components themselves, which means, that it is not possible to access parts under the heat sink for measurements or reworks. Another disadvantage is that removing heat sinks mounted by adhesive requires thermal treatment of the adhesive, which is a time consuming process and is likely to damage the circuit board component such as a chip.

SUMMARY OF THE INVENTION

This invention introduces a frame, which is mounted onto a blade board to hold multiple temporary heat sinks on top of a board component, such as a chip. The heat sinks are placed onto the chips by the frame, without any additional fixing mechanisms such as adhesives or screws. Thermal oil is applied between the surface of the chips and the bottom of the heat sinks for the right level of heat absorption. The oil facilitates the transfer of heat from the component to the heat sink. Alternatively, conductive paste, or a pad interface material may be used in lieu of the thermal oil.

An aspect of an embodiment of the invention provides a heat sink mounting frame that is easily attached to the board during testing of the board's components during the manufacturing stage of the circuit board.

A further aspect of an embodiment of the invention provides a heat sink mounting frame that is easily removed from the circuit board after testing without causing damage to the circuit board or its components.

A further aspect of an embodiment of the invention provides a heat sink frame that does not require a complicated permanent fixing of the heat sinks onto the chips during the manufacturing process.

A further aspect of an embodiment of the invention provides a heat sink frame that provides access to components beneath the frame that may require reworks or measurements.

A further aspect of an embodiment of the invention provides a heat sink frame that is sized to mount to the board only in an area that contains the board components to be cooled.

Additional aspects, objectives, features and advantages of the present invention will become apparent from the following description of the preferred embodiments with reference to the attached drawings.

DETAILED DESCRIPTION OF THE INVENTION

Figure 1:
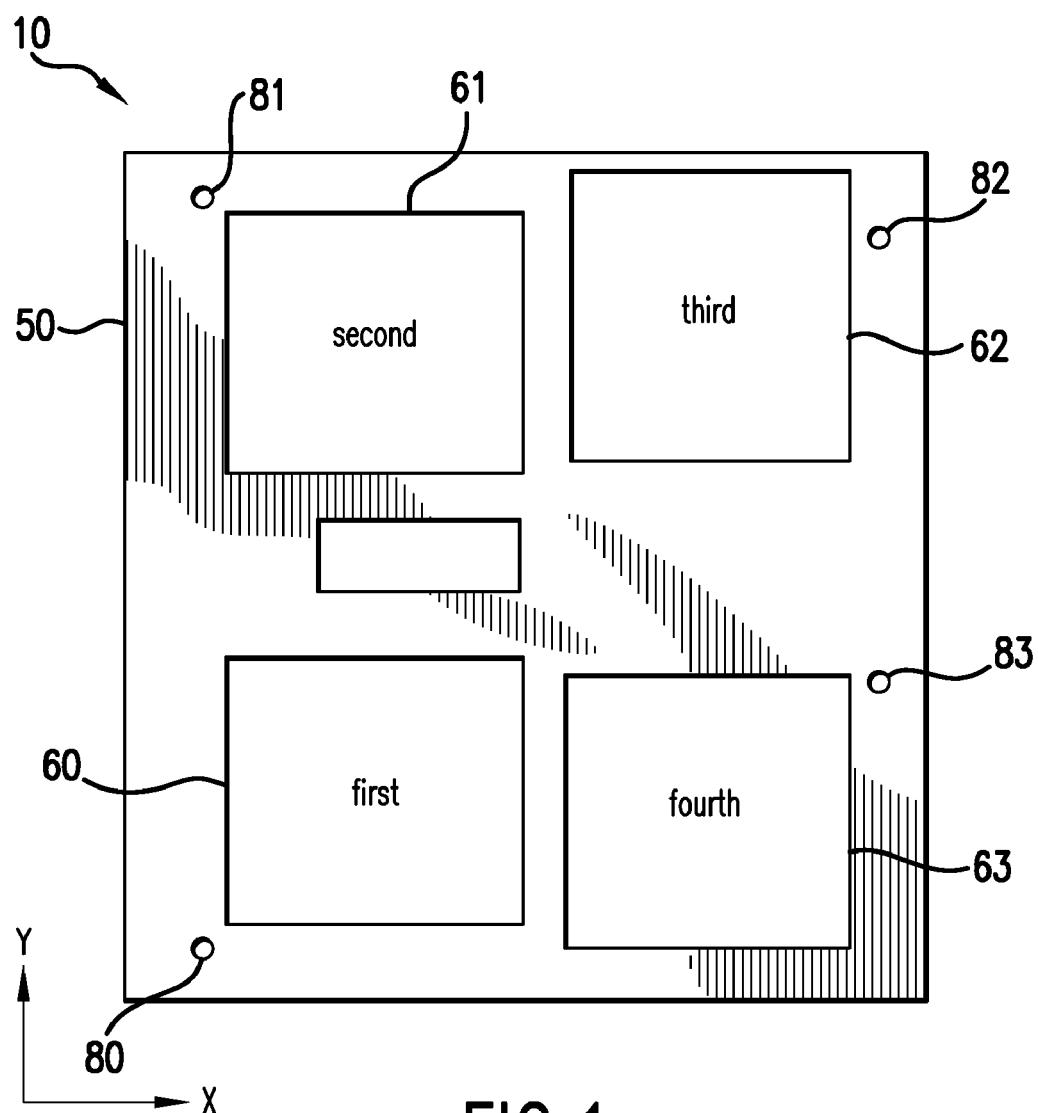
FIG. 1 is schematic plan view of an apparatus for mounting a plurality of heat sinks onto a circuit board.

Referring to the figures, FIG. 1 is a schematic plan view of an apparatus 10 for mounting a plurality of heat sinks 20, 21, 22, 23 onto a circuit board 30. The circuit board 30 contains a plurality of frame mounting holes 35. The mounting holes 35 serve as anchors for the receipt of the apparatus 10 during testing of the circuit board 30. During testing of the processing element components 40 on the circuit board 30, the circuit board is typically in a fixed manufacturing station.

The apparatus 10 is used during logic testing, however, the apparatus 10 can be used to mount a plurality of heat sinks 20, 21, 22, 23 during additional testing that will require the processing element components 40 to be cooled. The mounting holes 35 are preexisting holes on the circuit board 30 used after testing to secure the permanent heat sinks (not shown) to the circuit board 30. The permanent heat sinks can be mounted to the circuit board 30 at the mounting holes 35 using known mounting techniques such as screws, clips or any other structurally sound attachment method.

The apparatus 10 is a rectangular shaped frame 50 with a size that is limited to an area on the circuit board 30 which contains a plurality of data processing elements 40 to be cooled. The shape of the frame can be any polygonal shape so long as the shape is limited to the size of the processing elements 40 to be cooled. The frame's dimensions are 160 mm×189 mm (length×width). The dimensions of the frame may be altered to accommodate larger or smaller circuit board testing areas. The frame's 50 size does not impose on the space around the circuit board components that do not require cooling so that the frame provides easy access to other areas on the circuit board. The frame 50 is manufactured from a non-conductive material that is electro-statically safe yet rigid enough to give the heat sinks 20, 21, 22, 23 the necessary support and guidance.

There are at least four apertures 60, 61, 62, 63 on the frame 50, wherein each of the at least four apertures 60, 61, 62 63 corresponds to a different one 40A, 40B, 40C, 40D, collectively 40, of the plurality of data processing elements to be cooled, respectively. The apertures 60, 61, 62, 63 are rectangular shaped openings that are slightly larger than the size of the temporary heat sinks 20, 21, 22, 23 to be supported by the apertures 60, 61, 62, 63 respectively. The apertures 60, 61, 62, 63 provide a few millimeter spacing on each side of the heat sinks 20, 21, 22, 23 for additional venting of the heat. The heat sinks 20, 21, 22, 23 can be easily dropped through the apertures 60, 61, 62, 63 onto the data processing elements 40, such as the processor chips found on the circuit board 30. Heat sink 20 is placed into a first aperture 60. Heat sink 21 is inserted into a second aperture 61. Heat sink 22 is inserted into a third aperture 62 and heat sink 23 is inserted into a fourth aperture 63. This frame 50 is capable of mounting multiple temporary heat sinks 20, 21, 22, 23 onto a circuit board element to be cooled with no additional fixings such as glue or screws being used on the heat sink. The heat sinks 20, 21, 22 and 23 are held in place due to the frame 50.

Figure 3:
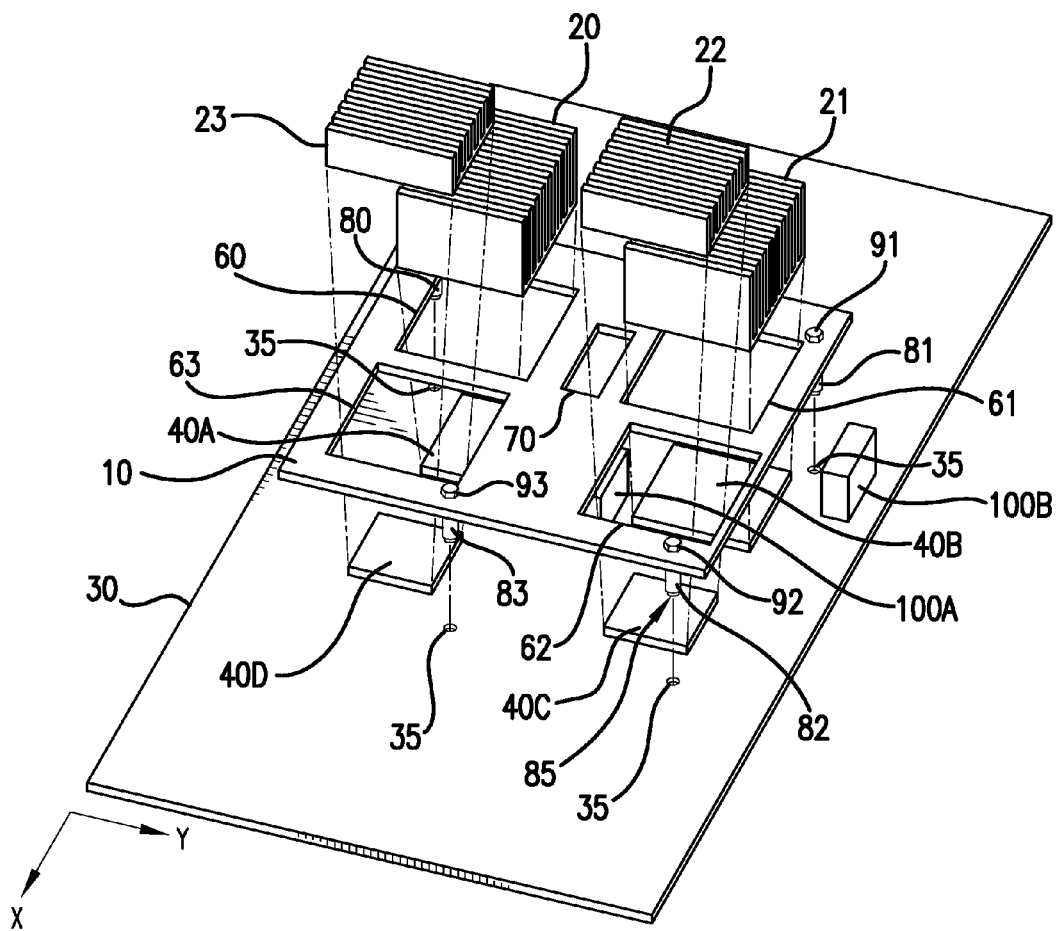
FIG. 3 is an exploded perspective view of the apparatus of FIG. 1 accommodating processing elements on a circuit board.

The first aperture 60 and the second aperture 61 are 54 mm×52 mm (length×width). The third aperture 62 and the fourth aperture 63 are 56 mm×55 mm (length×width). The dimensions of the apertures 60, 61, 62, 63 can be larger or smaller depending on the actual size of the circuit board. Similarly, additional apertures or fewer apertures may be included on the frame depending on the size of the frame and the size of the circuit board area with components to be tested. As shown in FIG. 1 and FIG. 3, the first aperture 60 and the second aperture 61 are parallel to the third aperture 62 and the fourth aperture 63 on the x-y plane. The apertures 60, 61, 62, 63 are each located near each corner of the frame 50. At least 10 mm of space is provided between the first aperture and the fourth aperture and between the second aperture and the third aperture, along the x axis. More or less spacing may be provided depending on the processing elements positions on the circuit board.

The frame 50 also comprises a slot 70 to receive or accommodate oversized processing elements 100 such as a voltage regulator, for example. For use as an example, oversized processing element one 100A and oversized processing element two 100B are two oversized processing elements. The dimensions of the frame are adjusted such that most oversized components like the processing element 100B are outside of the frame. However, the oversized processing element 100A extends or protrudes out of the slot 70 and above the frame 50 when the frame is mounted onto the circuit board 30. For accommodating this oversized processing element, the slot 70 is provided. The slot 70 is rectangular in shape and is smaller than the apertures 60, 61, 62, 63 in size. The slot 70 is 40 mm×12 mm (length×width). However, the dimensions and shape of the slot 70 can vary depending on the size of the circuit board 30 and the number of oversized processing elements 100 on the circuit board 30. Furthermore, additional slots may be added to the frame 50 to accommodate multiple oversized processing elements on the circuit board 30.

The slot 70 is positioned above the first aperture 60 and the slot is positioned below the second aperture 61. No other apertures or slots appear between the first aperture 60 and the second aperture 61. The positioning of the slot 70 is significant in that the slot 70 help to allow the frame 50 to mount over the processing elements 40 to be cooled without being hindered by oversized processing elements 100. The frame 50 does not have to maneuver around the oversized processing elements such as oversized processing element 100A. Instead, the frame 50 is positioned over this oversized processing element 100A. It is not necessary to provide multiple frames on the circuit board for mounting additional heat sinks because the frame is sized to accommodate all of the elements to be cooled without occupying additional areas on the circuit board.

The frame 50 is mounted onto the circuit board 30 by at least four pillars 80, 81, 82, 83 having a top portion 84 and a bottom portion 85 as shown in FIG. 3. The pillars 80, 81, 82, 83 are fixed by pillar screws 90, 91, 92, 93, respectively to the frame 50. The pillars 80, 81, 82, 83 are screwed to the bottom side of the frame 50 at the positions of the mounting holes 35 in the circuit board 30. In other words, when the frame is placed over the circuit board 30 over the area where the processing elements 40 are to be cooled, the pillars will align with the mounting holes 35 on the circuit board 30. The pillars 80, 81, 82, 83 are manufactured from a carbon material.

Figure 2:
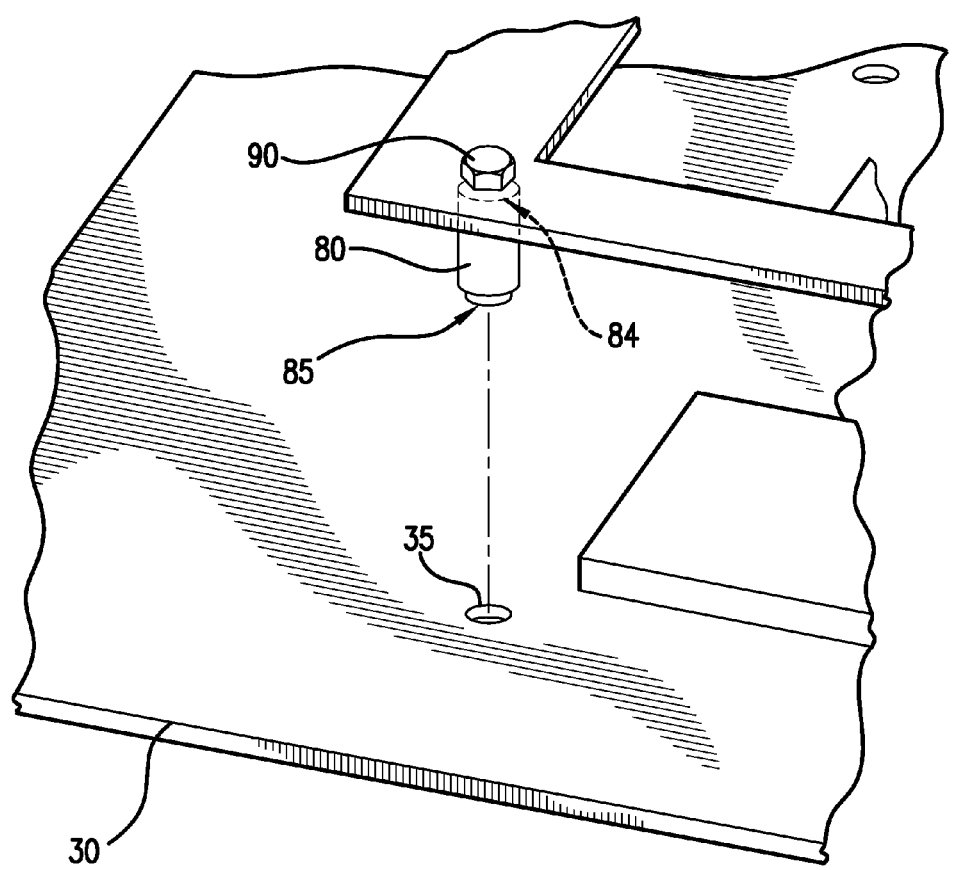
FIG. 2 is an isometric view, taken from above, of a portion of the apparatus of FIG. 1.

Each of the pillars 80, 81, 82, and 83 are secured to the frame 50 using the same screw mechanism. Also, each of the pillars 80, 81, 82, and 83 has the identical shape, size and features. Thus, by way of example only, the attachment of pillar 80 will be discussed. FIG. 2 shows pillar 80 mounted into a mounting hole 35. A pillar screw 90 is screwed through the frame 50 into the top portion 84 of the pillar 80. The screw 90 is threaded into the pillar 80. Although a screw is used to secure the pillar to the frame, other known securing methods may be used to attach the pillar. The bottom portion 85 of the pillar 80 extends downwardly from the frame 50. The bottom portion 85 of the pillar 80 has an indention which is the size of the diameter of the receiving hole. The indented bottom portion 85 of the pillar 80 snaps into the mounting holes 35 by the bottom portion 85 of the pillar 80. The weight of the frame 50 prevents the pillars 80, 81, 82, 83 from coming out of the holes 35 during testing. Once the pillars 80, 81, 82, 83 are engaged into the plurality of frame mounting holes 35 on the circuit board 40, the frame 50 extends over the circuit board 30. The frame 50 extends at least 7 mm above the circuit board 30 providing an access area beneath the frame 50. The access area provides a 7 mm clearance such that probes can contact the processing elements 40 underneath the frame if more attention needs to be paid to the element 40 without having to remove the frame 50.

After testing, the final or non-temporary heat sinks will be placed and fixed by permanent heat sink screws to the circuit board 30. The permanent heat sink screws secure the permanent heat sinks to the circuit board by screwing the permanent heat sinks on the board 30 at the location where the temporary heat sinks 20, 21, 22, 23 were previously located during testing. However, additional securing mechanisms may be used to secure the permanent heat sinks.

FIG. 3 is an exploded perspective view of the apparatus of FIG. 1 accommodating processing elements 40 on a circuit board 30. As shown in FIG. 3, the frame 50 is mounted onto the circuit board 30 by the pillars 80, 81, 82, 83. The pillars 80, 81, 82, 83 snap into the mounting holes 35 on the circuit board 30. The apertures 60, 61, 62, 63 expose the processing elements 40 on the circuit board 30 to be cooled. The slot 70 provides an opening for the oversized processing element 100A so that the oversized processing element 100A can extend through the slot 70 and not interfere with the testing. Once the frame 50 is placed on the board 30, multiple heat sinks 20, 21, 22, 23 are placed into its respective aperture 60, 61, 62, 63. The walls of the apertures 60, 61, 62, 63 and the weight of the frame 50 hold the heat sinks 20, 21, 22, 23 in place. No additional clips, screws or fixing mechanisms are required to hold or position the heat sinks in their respective positions. Thus, the frame uses minimal space on the board due to its size and lack of additional clips or screws that take up additional space on the circuit board.

Thermal oil is applied to the bottom of the heat sinks 20, 21, 22, 23 to improve the temperature dissipation and increases heat distribution from the top of the processing elements 40 the respective heat sink 20, 21, 22, 23 placed above the processing elements 40. Between 0.1 ml to 0.3 ml of oil is added to the heat sinks. This amount depends on the size of the area covered by the heat sink. The heat sinks are mounted to the circuit board by the frame and thermal oil. No additional screws or adhesives are required to secure the temporary heat sinks. The operator can easily attach the frame to the board under test and place the heat sinks onto the chips for cooling. This process enables a fast turn-around of tested boards because it avoids a complicated fixing procedure. At least one hour is spared using this attachment apparatus versus the more complicated and more permanent attachment methods of mounting a heat sink.

The invention has been described in detail with particular reference to certain preferred embodiments thereof, but it will be understood that variations and modifications can be effected within the spirit and scope of the invention.

PARTS LIST

10—Apparatus for mounting heat sinks
20, 21, 22, 23—Temporary Heat Sinks
30—Circuit Board
35—Mounting Holes
40—Processing elements to be cooled
50—Frame
60, 61, 62, 63—Apertures
40A, 40B, 40C, 40D—four of the processing elements to be cooled
70—Slot
80, 81, 82, 82—Pillars
84—Top portion of the pillars
85—Bottom portion of the pillars
90, 91, 92, 93—Pillar Screws
100—oversized processing elements
100A—oversized processing element one
100B—oversized processing element two

The invention claimed is:

1. A method for mounting a plurality of heat sinks onto a circuit board, wherein the circuit board contains a plurality of frame mounting holes, the method comprising:

providing a polygonal shaped frame with a size that is limited to an area on the circuit board which contains a plurality of data processing elements to be cooled;

providing at least four apertures on the frame, wherein each of the at least four apertures corresponds to a different one of the plurality of data processing elements to be cooled;

wherein the heat sinks are placed in the apertures without any additional fastener mechanisms, and providing at least four pillars, each one of the at least four pillars having a top portion and a bottom portion;

securing the top portion to a bottom side of the frame wherein the bottom portion extends downwardly from the frame and engaging the bottom portion into the plurality of frame mounting holes on the circuit board such that the frame extends over the circuit board, wherein no additional fixtures are necessary to support the frame.

* * * * *